United States Patent
Schmedake et al.

(10) Patent No.: US 12,408,546 B2
(45) Date of Patent: Sep. 2, 2025

(54) HEXACOORDINATE PINCER COMPLEXES AND APPLICATIONS THEREOF

(71) Applicant: The University of North Carolina at Charlotte, Charlotte, NC (US)

(72) Inventors: Thomas Andrew Schmedake, Charlotte, NC (US); Michael George Walter, Charlotte, NC (US); Yong Zhang, Charlotte, NC (US); Margaret Kocherga, Charlotte, NC (US)

(73) Assignee: THE UNIVERSITY OF NORTH CAROLINA AT CHARLOTTE, Charlotte, NC (US)

( * ) Notice: Subject to any disclaimer, the term of this patent is extended or adjusted under 35 U.S.C. 154(b) by 838 days.

(21) Appl. No.: 17/057,308

(22) PCT Filed: May 29, 2019

(86) PCT No.: PCT/US2019/034348
§ 371 (c)(1),
(2) Date: Nov. 20, 2020

(87) PCT Pub. No.: WO2019/232018
PCT Pub. Date: Dec. 5, 2019

(65) Prior Publication Data
US 2021/0217974 A1    Jul. 15, 2021

Related U.S. Application Data

(60) Provisional application No. 62/677,285, filed on May 29, 2018.

(51) Int. Cl.
| | |
|---|---|
| H10K 85/40 | (2023.01) |
| C07F 7/02 | (2006.01) |
| C09K 11/06 | (2006.01) |
| H10K 50/16 | (2023.01) |
| H10K 85/60 | (2023.01) |
| H10K 101/30 | (2023.01) |

(52) U.S. Cl.
CPC ............. *H10K 85/40* (2023.02); *C07F 7/025* (2013.01); *C09K 11/06* (2013.01); *C09K 2211/1018* (2013.01); *H10K 50/16* (2023.02); *H10K 85/654* (2023.02); *H10K 85/6572* (2023.02); *H10K 2101/30* (2023.02)

(58) Field of Classification Search
None
See application file for complete search history.

(56) References Cited

U.S. PATENT DOCUMENTS

| | | | |
|---|---|---|---|
| 2012/0004407 A1* | 1/2012 | Stoessel | C07F 15/004 548/108 |
| 2014/0275599 A1 | 9/2014 | Hattori | |
| 2016/0355534 A1 | 12/2016 | Chi et al. | |

OTHER PUBLICATIONS

Kocherga, Margaret, et al. "Si (bzimpy) 2-a hexacoordinate silicon pincer complex for electron transport and electroluminescence." Chemical Communications 54.100 (2018): 14073-14076. (Year: 2018).*

Suthar, Binita, et al. "Electrochemical and spectral properties of hexacoordinate polypyridyl silicon complexes." Polyhedron 31.1 (2012): 754-758. (Year: 2012).*

Sharma, Ritambhara, and Mangalampalli Ravikanth. "Synthesis, Structure and Properties of the First Examples of Hexacoordinate SnIV Complexes of Pyrrolyldipyrrins." European Journal of Inorganic Chemistry 2017.4 (2017): 829-834. (Year: 2017).*

Kano, Naokazu. "Penta-and hexacoordinated silicon (IV) compounds." Organosilicon Compounds (2017): 645-716. (Year: 2017).*

International Search Report and Written Opinion corresponding to PCT/US2019/034348, mailed Aug. 12, 2019, 6 pages.

Darmawan N. et al., "Efficient near-UV emitters based on cationic bis-pincer iridium(III) carbene complexes", Inorganic Chemistry, 2013, vol. 52, issue 19, p. 10756-10765; retrieved from the Internet: <DOI: 10.1021/ic302695q> see entire document, especially, p. 10757-10761, 10763.

El Ezzi M. et al., "A bis-sulfonyl 0, C, 0 aryl pincer ligand and its tin(II) complex: synthesis, structural studies, and OFT calculations", Angewandte Chemie, 2014, vol. 54, issue 3, pp. 805-808; retrieved from the Internet: <DOI: 10.1002/anie.201406283> see entire document, especially, p. 805-807.

Peloquin D. M. et al., "Recent advances in hexacoordinate silicon with pyridine-containing ligands: Chemistry and emerging applications", Coordination Chemistry Reviews, 2016, vol. 323, pp. 107-119; retrieved from the Internet: <DOI: 10.1016/j.ccr.2016.02.005> see entire document, especially, p. 117-118.

First Office Action mailed Apr. 22, 2023, China application No. 201980036434.8, 14 pages.

Suthar, Binita et al., Electrochemical and spectral properties of hexacoordinate polypyridyl silicon complexes, Polyhedron 31 (2012) pp. 754-758.

Gerlach, Daniela et al., Silicon(IV) Chelates of an (ONN')-Tridentate Pyrrole-2-Carbaldimine Ligand: Syntheses, Structures and UV/Vis Properties, Z. Naturforsch. 2009, 64b, 1571-1579; received Sep. 14, 2009.

(Continued)

*Primary Examiner* — Dawn L Garrett

(74) *Attorney, Agent, or Firm* — J. Clinton Wimbish; Maynard Nexsen PC

(57) ABSTRACT

A variety of hexacoordinate pincer complexes are described herein having electronic structure advantageous for electronic and/or optoelectronic applications. In some embodiments, the pincer complexes are luminescent, exhibiting fluorescence and/or phosphorescence. Briefly, a hexacoordinate complex comprises a central atom selected from the group consisting of silicon, germanium, and tin, and two pincer ligands bound to the central atom, wherein the hexacoordinate complex is luminescent. In another aspect, a hexacoordinate complex comprises a central atom selected from the group consisting of silicon, germanium and tin, and two pincer ligands bound to the central atom, wherein the difference between the highest occupied molecular orbital (HOMO) and lowest unoccupied molecular orbital (LUMO) of the hexacoordinate complex is at least 1.5 eV.

31 Claims, 12 Drawing Sheets

(56) References Cited

OTHER PUBLICATIONS

Wagler, Jorg et al., Intramolecular Interligand Charge Transfer in Hexacoordinate Silicon Complexes, Organometallics 2006, 25, pp. 2929-2933.
Metz, Stefan et al., Synthesis and Structural Characterization of Novel Neutral Hexacoordinate Silicon(IV) Complexes with $SIS_2O_2N_2$ Skeletons, European Journal of Inorganic Chemistry (2008), (28), pp. 4433-4439.
Bohme, Uwe et al., Five and six-coordinate silicon complexes with an O,N,O'-chelating ligand derived from o-hydroxyacetophenone-N-(2-hydroxyethyl)imine, Inorganic Chemistry Communications (2007), 10(4), pp. 482-484.
Chinese Application No. 201980036434.8, Second Office Action issued Dec. 1, 2023, 6 pages.
Chinese Application No. 201980036434.8, Third Office Action issued May 10, 2024, 7 pages.

* cited by examiner

HEXACOORDINATE PINCER COMPLEXES AND APPLICATIONS THEREOF

RELATED APPLICATION DATA

This application is a U.S. National Phase of PCT/US2019/034348, filed May 29, 2019, which claims priority to U.S. Provisional Patent Application Ser. No. 62/677,285 filed May 29, 2018, each of which are incorporated herein by reference in their entireties.

STATEMENT OF GOVERNMENT RIGHTS

This invention was made with government support under Grant No. CHE-1800331 awarded by the National Science Foundation. The government has certain rights in the invention.

FIELD

The present invention relates to pincer complexes and, in particular to hexacoordinate complexes comprising two pincer ligands and various applications thereof.

BACKGROUND

Metal chelates such as tris(8-hydroxyquinolinato)aluminium, Alq$_3$, have been frequently used as electroluminescent layers (ELs) and/or as electron transport layers (ETLs) in a wide range of organic and hybrid electronic devices, ever since the first efficient organic light emitting diode (OLED) device was reported. In addition to being a workhorse of the OLED field, Alq$_3$ and related metal chelates are routinely used in organic solar cells, perovskite solar cells, memory/spintronic devices and many other organic and hybrid electronic devices. In recent years, there has been a sustained interest in developing new materials for organic electronic devices, and there is particularly a need for new low molecular weight, chemically and electrochemically robust, ETL materials.

SUMMARY

In view this need, a variety of hexacoordinate pincer complexes are described herein having electronic structure advantageous for electronic and/or optoelectronic applications. In some embodiments, the pincer complexes are luminescent, exhibiting fluorescence and/or phosphorescence. Briefly, a hexacoordinate complex comprises a central atom selected from the group consisting of silicon, germanium, and tin, and two pincer ligands bound to the central atom, wherein the hexacoordinate complex is luminescent. In another aspect, a hexacoordinate complex comprises a central atom selected from the group consisting of silicon, germanium and tin, and two pincer ligands bound to the central atom, wherein the difference between the highest occupied molecular orbital (HOMO) and lowest unoccupied molecular orbital (LUMO) of the hexacoordinate complex is at least 1.5 eV. Pincer ligands and the central atom can have any structure and/or properties operable to provide complexes with electronic structure enabling luminescence and the bandgaps described herein. Hexacoordinate complexes described herein, for example, can be homoleptic or heteroleptic.

In another aspect, optoelectronic devices are provided. In some embodiments, an optoelectronic device comprises a layer including hexacoordinate complex. The hexacoordinate complex comprises a central atom selected from the group consisting of silicon, germanium, and tin, and two pincer ligands bound to the central atom, wherein the hexacoordinate complex exhibits luminescence. In other embodiments, the hexacoordinate complex comprises a central atom selected from the group consisting of silicon, germanium, and tin, and two pincer ligands bound to the central atom, wherein the difference between the highest occupied molecular orbital (HOMO) and lowest unoccupied molecular orbital (LUMO) of the hexacoordinate complex is at least 1.5 eV. As described further herein, the layer can be composed entirely of the hexacoordinate complex. Alternatively, the hexacoordinate complex can be dispersed in a carrier to provide the layer.

These and other embodiments are further described in the following detailed description.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

I. Hexacoordinate Pincer Complexes

As described herein, hexacoordinate complexes, in some embodiments, comprise a central atom selected from the group consisting of silicon, germanium and tin, and two pincer ligands bound to the central atom, wherein the hexacoordinate complex is luminescent. Depending on the structure and chemical identities of the central atom and pincer ligands, the hexacoordinate complexes can emit light in the visible region and/or infrared regions of the electromagnetic spectrum. In some embodiments, hexacoordinate complexes emit light having one or more wavelengths of 400 nm to 700 nm. Table I provides several ranges of emission wavelengths from hexacoordinate complexes of the present disclosure.

TABLE I

| Hexacoordinate Complex M(pincer)$_2$ Emission (nm) |
| --- |
| 450-600 |
| 500-650 |
| 500-600 |
| 550-750 |

M = Si, Ge, Sn

Additionally, luminescence from the hexacoordinate complexes can be fluorescence, phosphorescence or combinations thereof. Moreover, the hexacoordinate complexes can exhibit desirable quantum yields. In some embodiments, the hexacoordinate complexes exhibit quantum yields greater than 50 percent or greater than 60 percent. Additionally, as detailed further herein, hexacoordinate complexes can exhibit photoluminescence and/or electroluminescence.

Pincer ligands bound to the central atom can have any structure and/or properties operable to provide complexes with electronic structure supporting luminescence. In some embodiments, at least one central atom binding site of the pincer ligands comprises a heteroaryl moiety. Heteroaryl moieties bound to the central atom, for example, can comprise pyridine, triazole or triazine moieties. Moreover, pincer ligands can exhibit various conjugated structures including fused aryl and/or fused heteroaryl structures. Generally, atoms of the pincer ligands binding to the central atom are selected from the group consisting of nitrogen, oxygen, and sulfur. In some embodiments, all three binding sites of a pincer ligand employ the same atom. In other embodiments, the binding sites of a pincer ligand employ differing atoms. For example, two binding sites may be oxygen and the remaining binding site is nitrogen. Any combination of binding site elements is contemplated herein.

Figure 1:
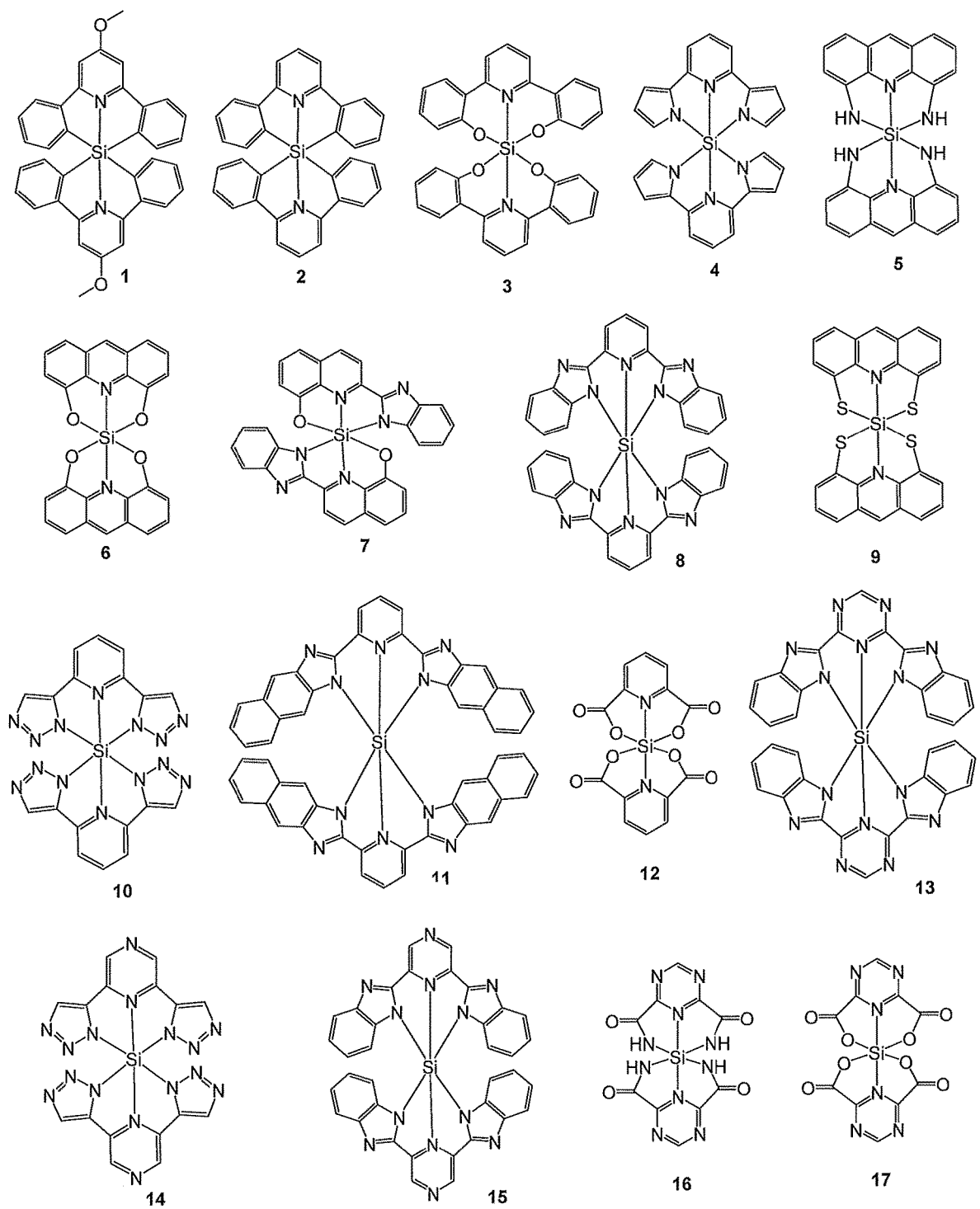
FIGS. 1-2 illustrates various hexacoordinate complexes according to embodiments described herein.
Figure 2:
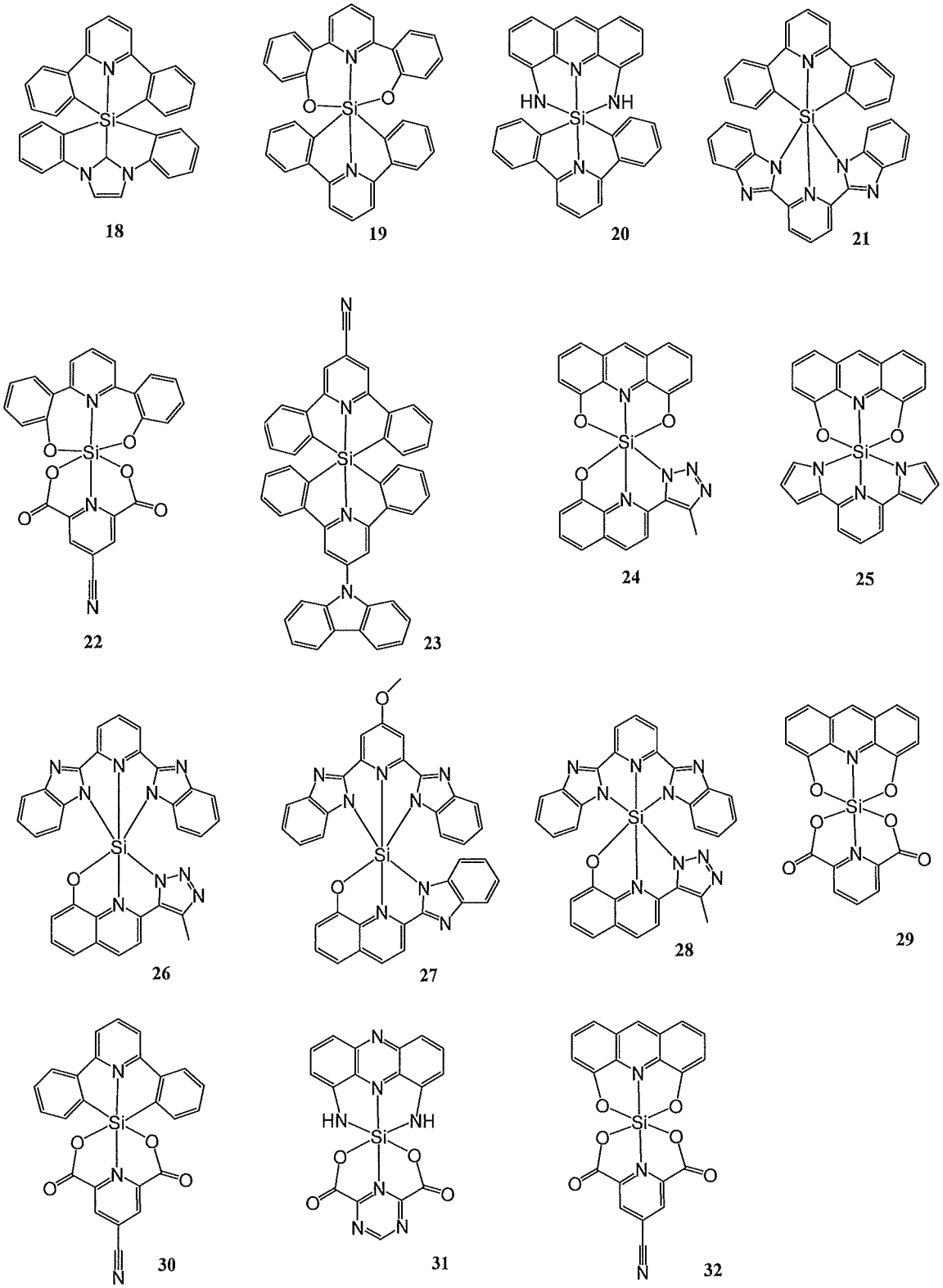

In some embodiments, the pincer ligands are dianionic. An anionic charge can reside on any two of the three binding sites of the ligand. Anionic charge, for example, can be located on the outer binding sites of the pincer ligand, wherein the inner or middle binding site is neutral. In other embodiments, anionic charges are located on adjacent binding sites of the pincer ligand. As described herein, the hexacoordinate complexes can be homoleptic. In such embodiments, the complexes can exhibit D$_{2d}$ symmetry. Alternatively, the hexacoordinate complexes can be heteroleptic. FIGS. 1 and 2 illustrate various non-limiting examples of hexacoordinate complexes having structure and properties described herein.

Figure 3:
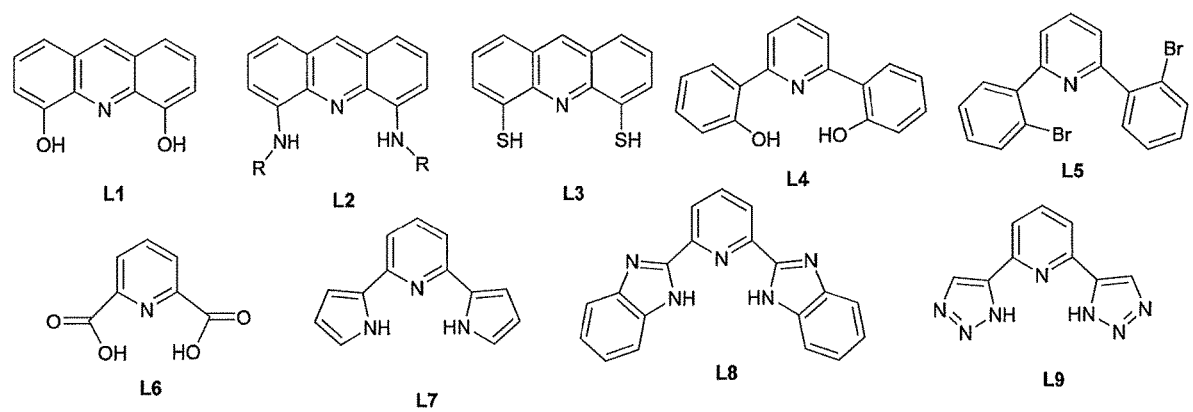
FIG. 3 illustrates various pincer ligands of hexacoordinate complexes according to some embodiments described herein.

As examples, hexacoordinate complexes can be synthesized using pincer ligands L1-L9 illustrated in FIG. 3. L8 can be synthesized through condensation of 2,6-pyridinedicarboxylic acid with 2 equivalents of o-phenylenediamine in polyphosphoric acid (PPA) according to Reaction 1, and variants of L8 can be obtained using modified starting materials. Larger polyacene ligands can be synthesized by condensation of a suitable diaminonaphthalene with 2,6-pyridinedicarboxylic acid.

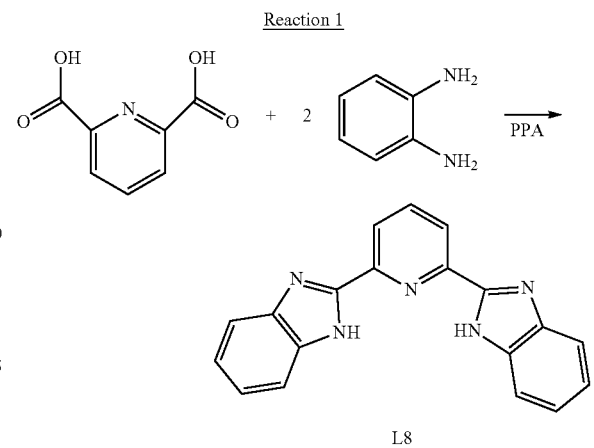

Reaction 1

Several variants of L7 can be synthesized by Pd catalyzed cross-coupling followed by hydrolysis/decarboxylation as shown in Reaction 2:

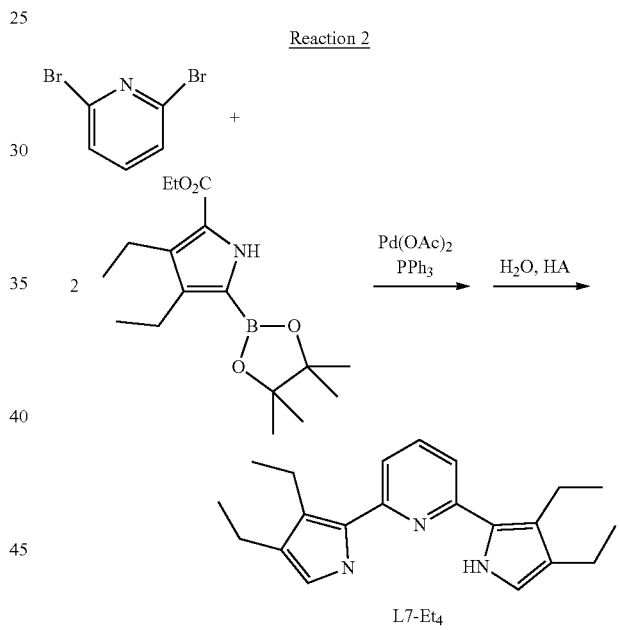

Reaction 2

Alternatively, a Fischer indole synthesis route can be used to synthesize the indole analog of L7, 2,6-di(2'-indolyl)pyridine from 2,6-diacetylpyridine and phenylhydrazine (Reaction 3).

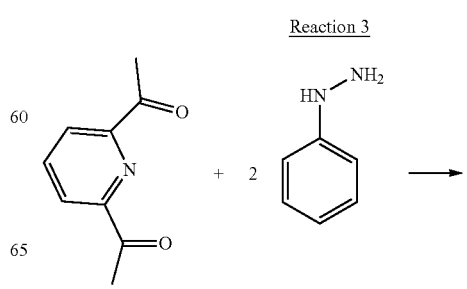

Reaction 3 and reaction of compound 11 in a pyridine-hydrochloride melt can demethylate 11 to yield L11 (Reaction 6).

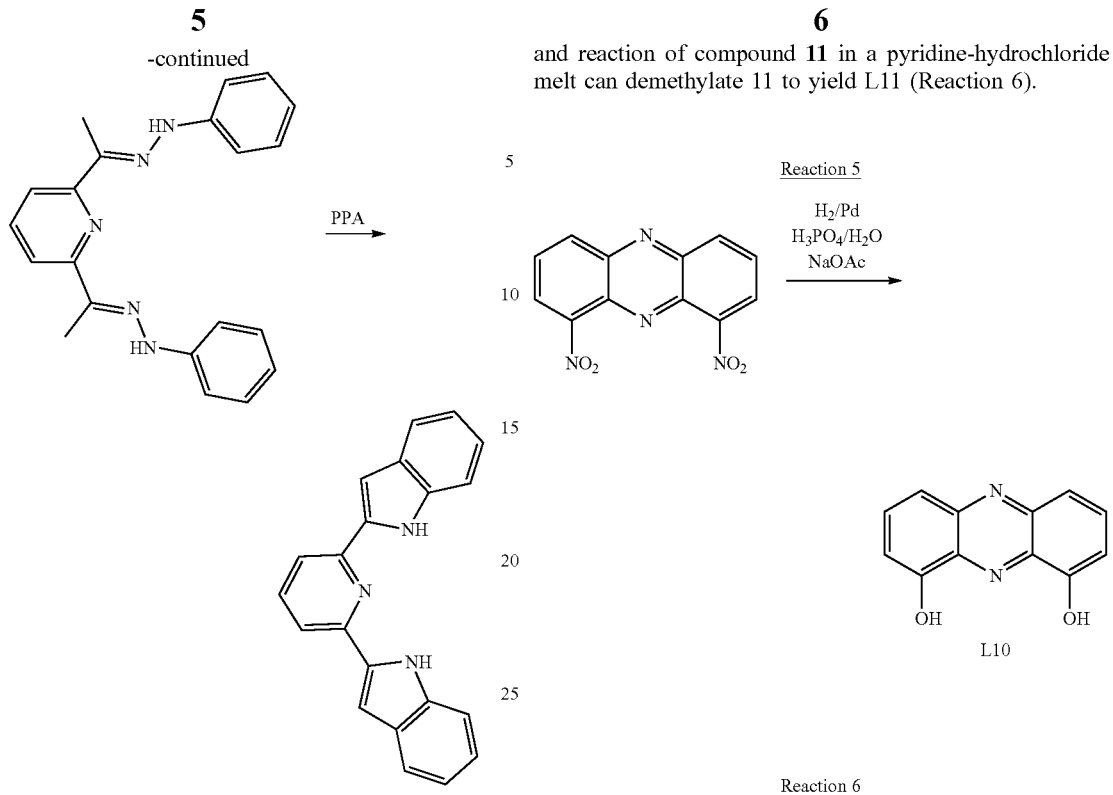

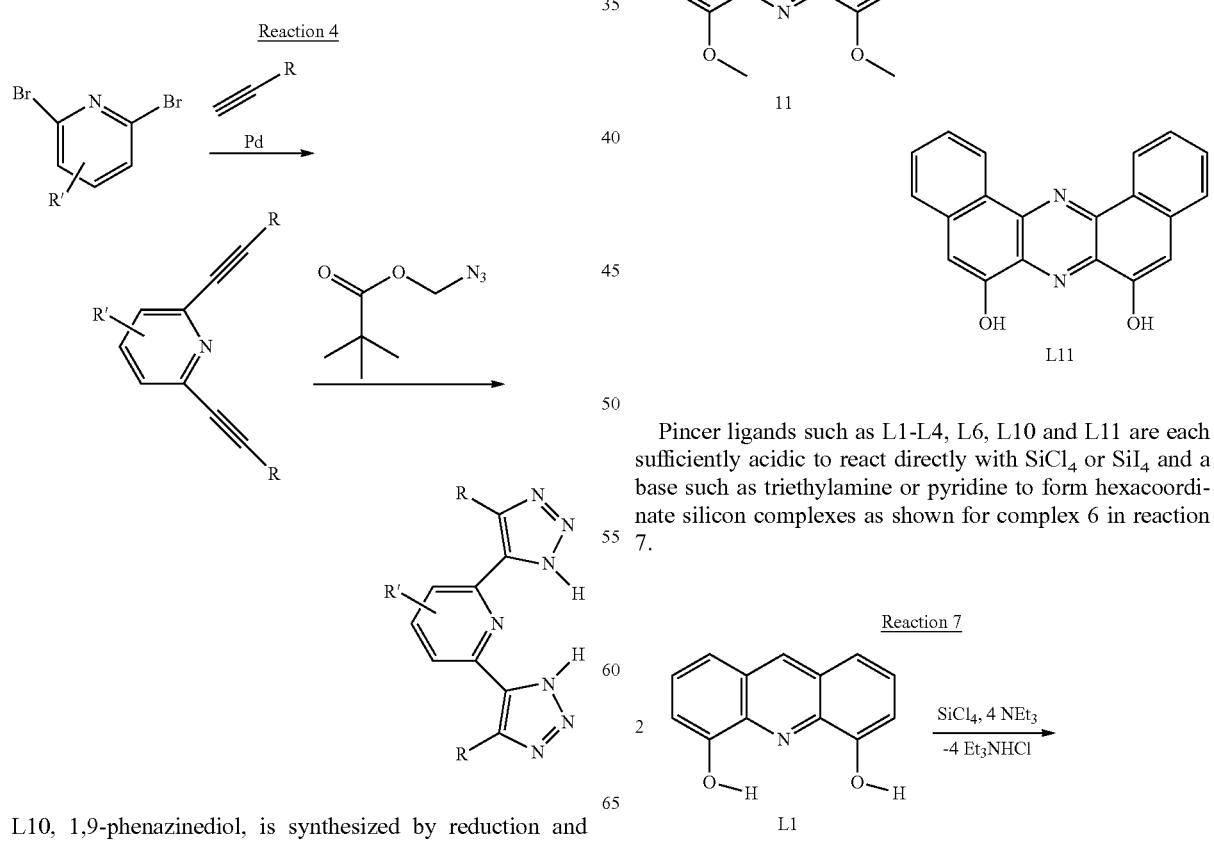

Variants of L9 can be synthesized via cycloaddition of azidomethyl pivalate followed by cleavage of the methyl pivalate group (Reaction 4).

L10, 1,9-phenazinediol, is synthesized by reduction and hydrolysis of 1,9-dinitrophenazine as shown in Reaction 5, Pincer ligands such as L1-L4, L6, L10 and L11 are each sufficiently acidic to react directly with $SiCl_4$ or $SiI_4$ and a base such as triethylamine or pyridine to form hexacoordinate silicon complexes as shown for complex 6 in reaction 7.

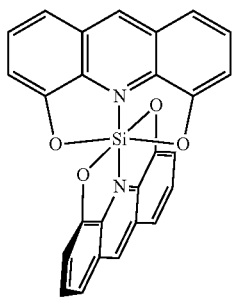

5

6

The lithiated dianionic pincer ligand can be generated and reacted with SiCl₄ for ligands that do not possess sufficiently acidic sites. For example, in complexes with phenyl rings attaching to the silicon center such as complex 2, the dibrominated ligand L5 is first converted to the lithiated dianionic ligand. Metal-halogen exchange of L5 with n-BuLi followed by reaction with SiCl₄ provides complex 2 (Reaction 8). Likewise, ligand L7 undergoes lithium-hydrogen exchange with n-BuLi to provide the dianionic pincer ligand, which is reacted with SiCl₄ to generate complex 4 (Reaction 9).

Reaction 8

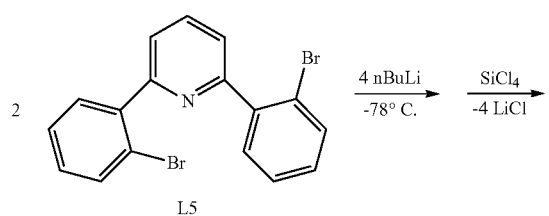

L5

2

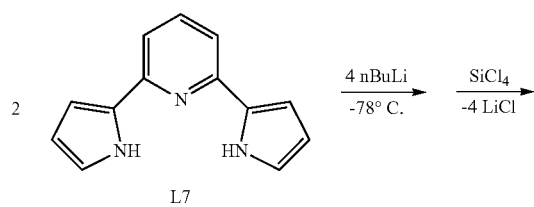

L7

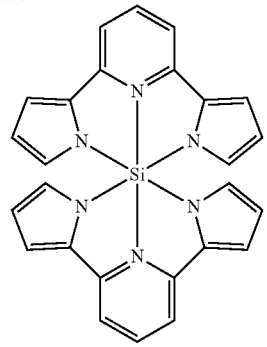

4

In another aspect, a hexacoordinate complex comprises a central atom selected from the group consisting of silicon, germanium and tin, and two pincer ligands bound to the central atom, wherein the difference between the highest occupied molecular orbital (HOMO) and lowest unoccupied molecular orbital (LUMO) of the hexacoordinate complex is at least 1.5 eV. In some embodiments, the difference between the HOMO and LUMO is at least 2.5 eV or at least 3 eV. Table II provides additional values for the HOMO/LUMO difference of hexacoordinate complexes according to some embodiments described herein.

TABLE II

| HOMO/LUMO Difference (eV) |
| --- |
| ≥4 |
| 1.5-4.8 |
| 2-4.7 |
| 2.5-4.5 |

Figure 4:
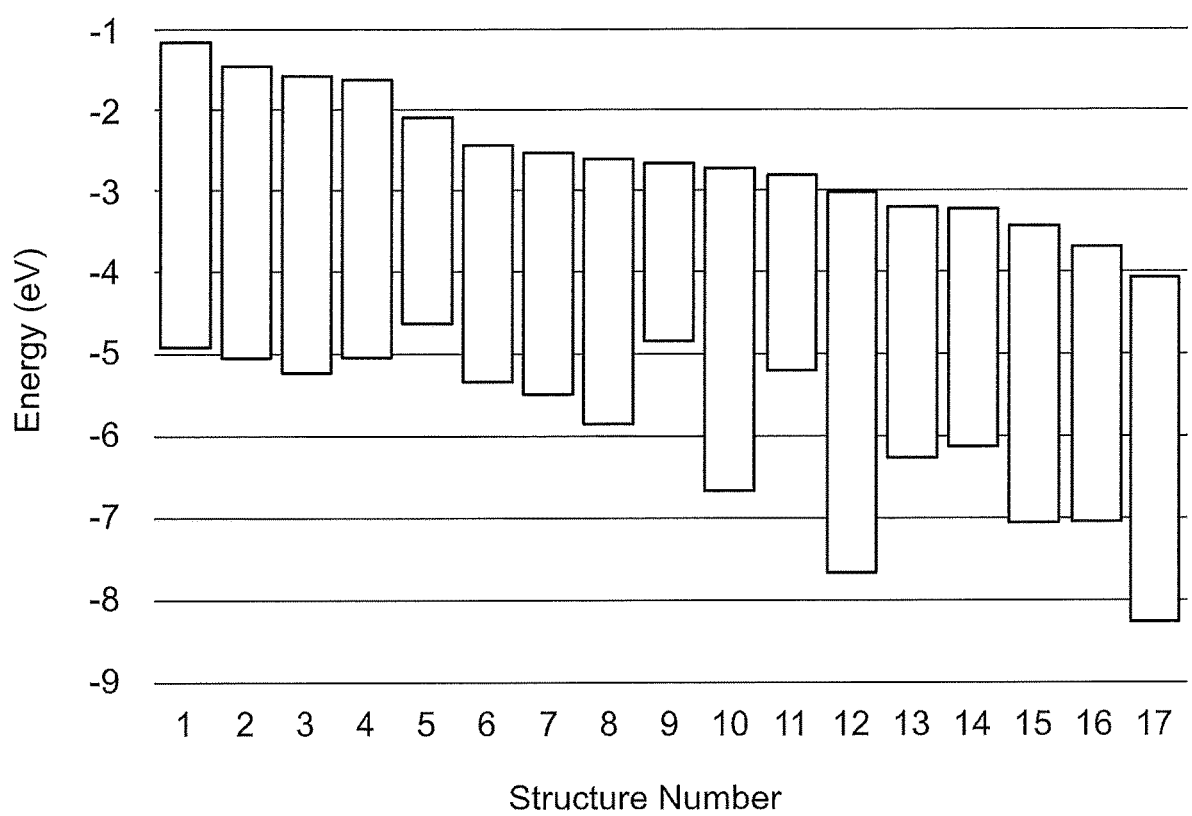
FIG. 4 illustrates the HOMO/LUMO difference for complexes 1-17 of FIG. 1.
Figure 5:
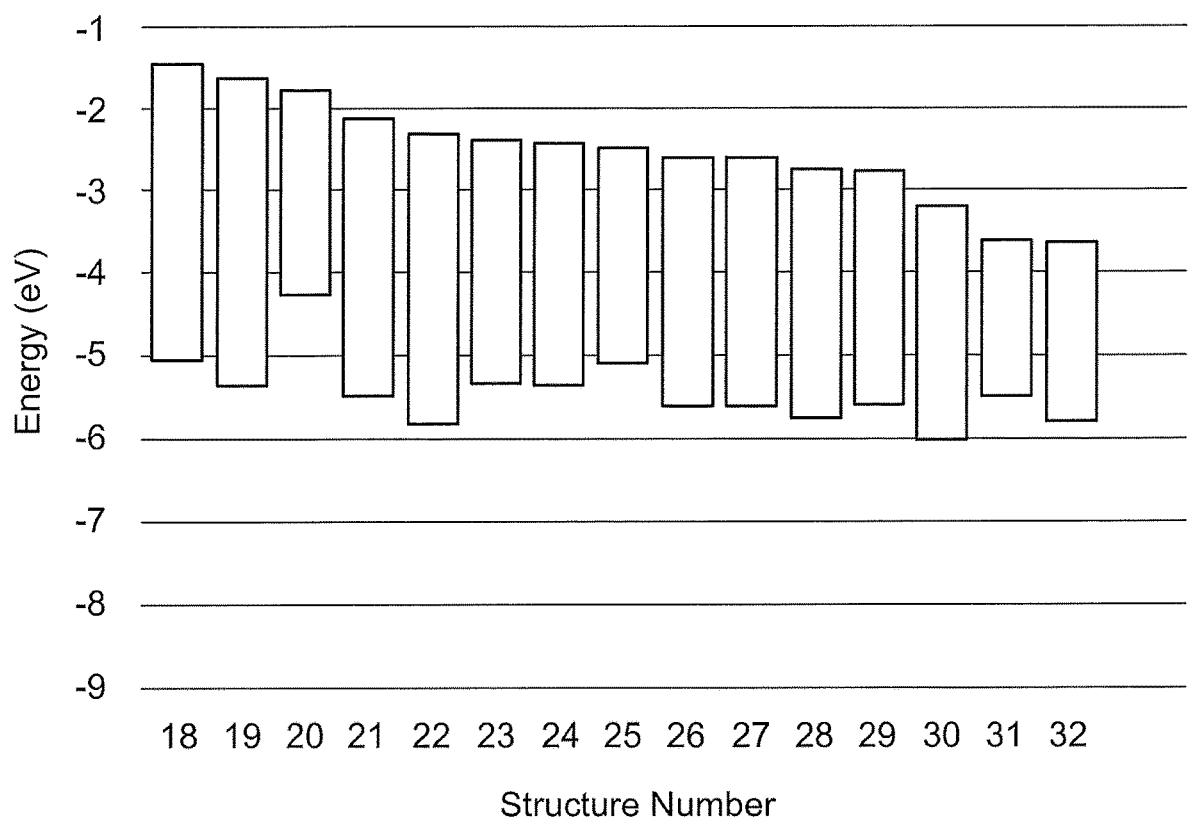
FIG. 5 illustrates the HOMO/LUMO difference for complexes 18-32 of FIG. 2.

Hexacoordinate complexes exhibiting the foregoing differences between the HOMO and LUMO are illustrated in FIGS. 1-2. FIG. 4 illustrates HOMO/LUMO differences for complexes 1-17 of FIG. 1. Similarly, FIG. 5 illustrates HOMO/LUMO differences for complexes 18-32 of FIG. 2.

Hexacoordinate complexes of the present disclosure can exhibit fluorescence, phosphorescence or combinations thereof. In some embodiments, an energy difference between the triplet state ($T_1$) and ground state ($S_0$) of a hexacoordinate complex is 1.5 eV to 3.5 eV. The $T_1$-$S_0$ difference can also be at least 2 eV, in some embodiments. Hexacoordinate complexes described herein can be employed in a variety of applications including, but not limited to, optoelectronic devices, such as organic light emitting diodes, spin organic light emitting devices and/or photovoltaics, spintronic devices and/or organic spin valves. Hexacoordinate complexes may also be used in biological applications as labeling agents.

II. Optoelectronic Devices

In another aspect, optoelectronic devices are provided. In some embodiments, an optoelectronic device comprises a layer including hexacoordinate complex. The hexacoordinate complex comprises a central atom selected from the group consisting of silicon, germanium, and tin, and two pincer ligands bound to the central atom, wherein the hexacoordinate complex exhibits luminescence. In other embodiments, the hexacoordinate complex comprises a central atom selected from the group consisting of silicon, germanium, and tin, and two pincer ligands bound to the central atom, wherein the difference between the highest occupied molecular orbital (HOMO) and lowest unoccupied molecular orbital (LUMO) of the hexacoordinate complex is at least 1.5 eV.

Hexacoordinate complexes of optoelectronic devices can have any structure, characteristics, and/or properties described in Section I above. In some embodiments, for example, a hexacoordinate complex has structure selected from FIGS. 1-2 herein.

The layer of the optoelectronic device can be composed entirely of the hexacoordinate complex. Alternatively, the hexacoordinate complex can be dispersed in a carrier to provide the layer. The hexacoordinate complex can also be combined or mixed with one or more materials of differing electronic structure to provide a bulk heterojunction architecture. The hexacoordinate complex, in some embodiments, can be mixed with a hole transport material to form a bulk heterojunction architecture.

In some embodiments, the hexacoordinate complex layer is an active layer of the optoelectronic device. The hexacoordinate complex layer, for example, can be a light emitting layer of the optoelectronic device, such as an organic light emitting diode. In photovoltaic applications, the hexacoordinate complex layer can be a light absorbing active layer. Moreover, the hexacoordinate complex layer can be a charge transport layer of the optoelectronic device. Depending on band structure of the device, the hexacoordinate complex layer can function as an electron transport layer (ETL) or hole transport layer (HTL). In some embodiments, hexacoordinate complex layers can exhibit charge mobilities ($\mu$) of at least $1\times10^{-4}$ cm$^2$ V$^{-1}$ s$^{-1}$. Charge mobilities, for example, can range from $1\times10^{-5}$ cm$^2$ V$^{-1}$ s$^{-1}$ to $1\times10^{-4}$ cm$^2$ V$^{-1}$ s$^{-1}$, in some embodiments.

The hexacoordinate complex layer can have any desired thickness consistent with the objectives of the present invention. Thickness of the hexacoordinate complex layer can be selected according several considerations including, but not limited to, function of the layer in the device. In some embodiments, the hexacoordinate complex layer has a thickness of 50 nm to 500 nm or 100 nm to 300 nm.

In being part of an optoelectronic device, the hexacoordinate complex layer can be arranged between electrodes. The hexacoordinate complex layer can be deposited directly on an electrode or one or more interlayers may be positioned between the hexacoordinate complex layer and the electrode. In some embodiments, at least one of the electrodes is radiation transmissive. In some embodiments, a radiation transmissive electrode comprises a radiation transmissive conducting oxide. Radiation transmissive conducting oxides can comprise one or more of indium tin oxide (ITO), gallium indium tin oxide (GITO), and zinc indium tin oxide (ZITO).

In some embodiments, a radiation transmissive electrode comprises one or more radiation transmissive polymeric materials, such as polyanaline (PANI) and its chemical relatives. A radiation transmissive first electrode, for example, can comprise 3,4-polyethylenedioxythiophene (PEDOT). In some embodiments, a radiation transmissive electrode comprises a carbon nanotube layer having a thickness operable to at least partially pass visible electromagnetic radiation. In some embodiments, a radiation transmissive electrode comprises a composite material comprising a nanoparticle phase dispersed in a polymeric phase. The nanoparticle phase, in some embodiments, can comprise carbon nanotubes, fullerenes, or mixtures thereof. Moreover, in some embodiments, a radiation transmissive electrode can comprise a metal layer having a thickness operable to at least partially pass visible electromagnetic radiation. The metal layer can comprise elementally pure metals or alloys. Metals suitable for use as a radiation transmissive electrode, in some embodiments, comprise high work function metals.

Figure 11:
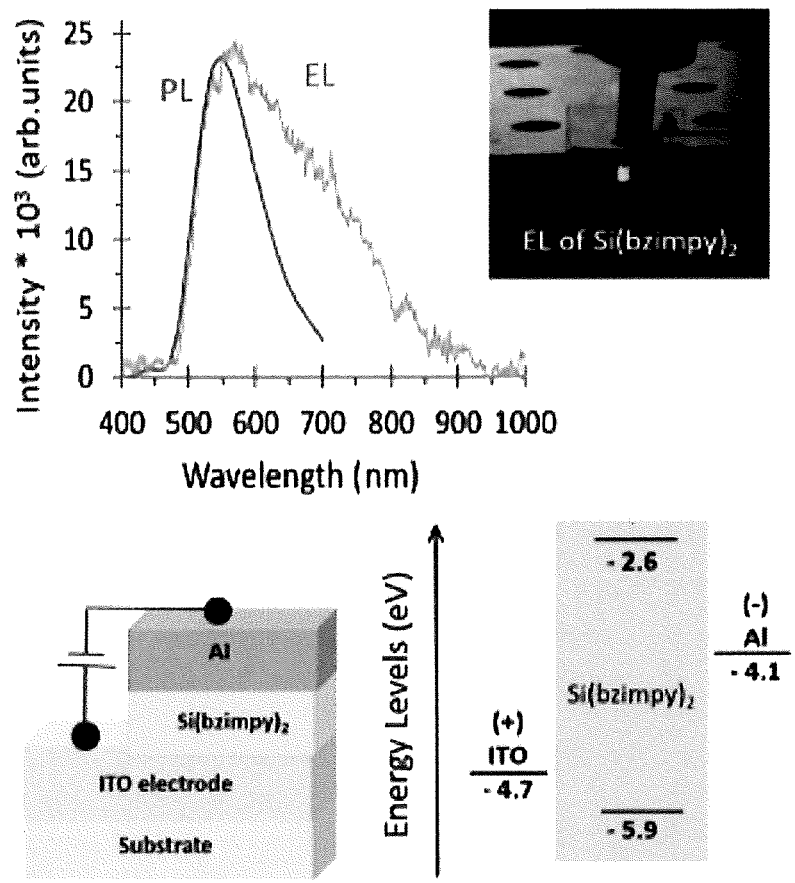
FIG. 11 illustrates an optoelectronic device and associated properties according to some embodiments described herein.

FIG. 11 illustrates an organic light emitting diode employing a hexacoordinate complex layer according to some embodiments.

In some embodiments, the hexacoordinate complex layer can be applied to existing optoelectronic devices as a light emitting layer. For example, the hexacoordinate complex can be applied to an existing optoelectronic device as a phosphor layer. The hexacoordinate complex layer could be applied to one or more surfaces of the optoelectronic device via thermal deposition, spin-coating, spray coating or other suitable technique. In some embodiments, the hexacoordinate complex layer can be positioned to receive light from the optoelectronic device for excitation and subsequent emission. In other embodiments, the hexacoordinate complex layer could receive electrical stimulation from the existing optoelectronic device.

These and other embodiments are further illustrated in the following examples.

Example 1—Synthesis and Characterization of Si(Bzimpy)$_2$

Complex 8 of FIG. 1 was synthesized by reaction of the 2,6-bis(2-benzimidazolyl)pyridine, bzimpy, with SiCl$_4$ (Reaction 10). Under a nitrogen atmosphere, bzimpy (2.036 g, 6.54 mmol) in chloroform (60 mL) was stirred at 0° C., and triethylamine (1.81 mL, 12.98 mmol) was added. Upon addition of silicon tetrachloride (0.37 mL, 3.2 mmol) the mixture instantly turned yellow and was allowed to stir for 3 min at 0° C. The resulting brownish-yellow suspension was warmed to room temperature, and reaction allowed to proceed for 16 h with no stirring. The obtained yellow solid was separated by filtration, washed with chloroform (2×15 mL), and dried in vacuum for 1 h at 120° C. The product was suspended in acetone (60 mL), stirred for 1 h, and filtered to yield spectroscopically pure, bright yellow powder (1.170 g). The low-solubility powder was placed in a Soxhlet extraction apparatus and continuously extracted with chloroform overnight. The resulting yellow, brightly luminescent solution was concentrated to dryness to obtain the monohydrate Si(bzimpy)$_2$·H$_2$O (0.826 g, 38% yield). $^{29}$Si $\delta$=−185.7 ppm. Anal. Calc. for C$_{38}$H$_{22}$N$_{10}$Si·H$_2$O: C, 68.7; H, 3.6; N, 21.1%. Found: C, 68.8; H, 3.9; N, 20.9%. MS (MALDI-TOF): m/z=646.6. The product is further purified by sublimation under reduced pressure.

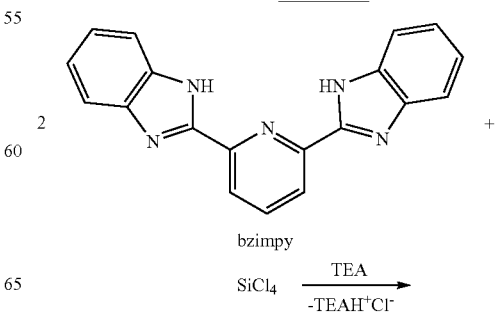

-continued

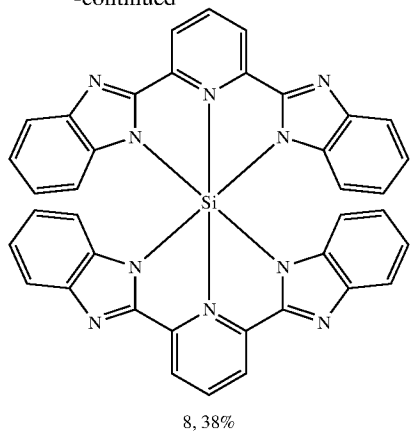

8, 38%

Figure 6:
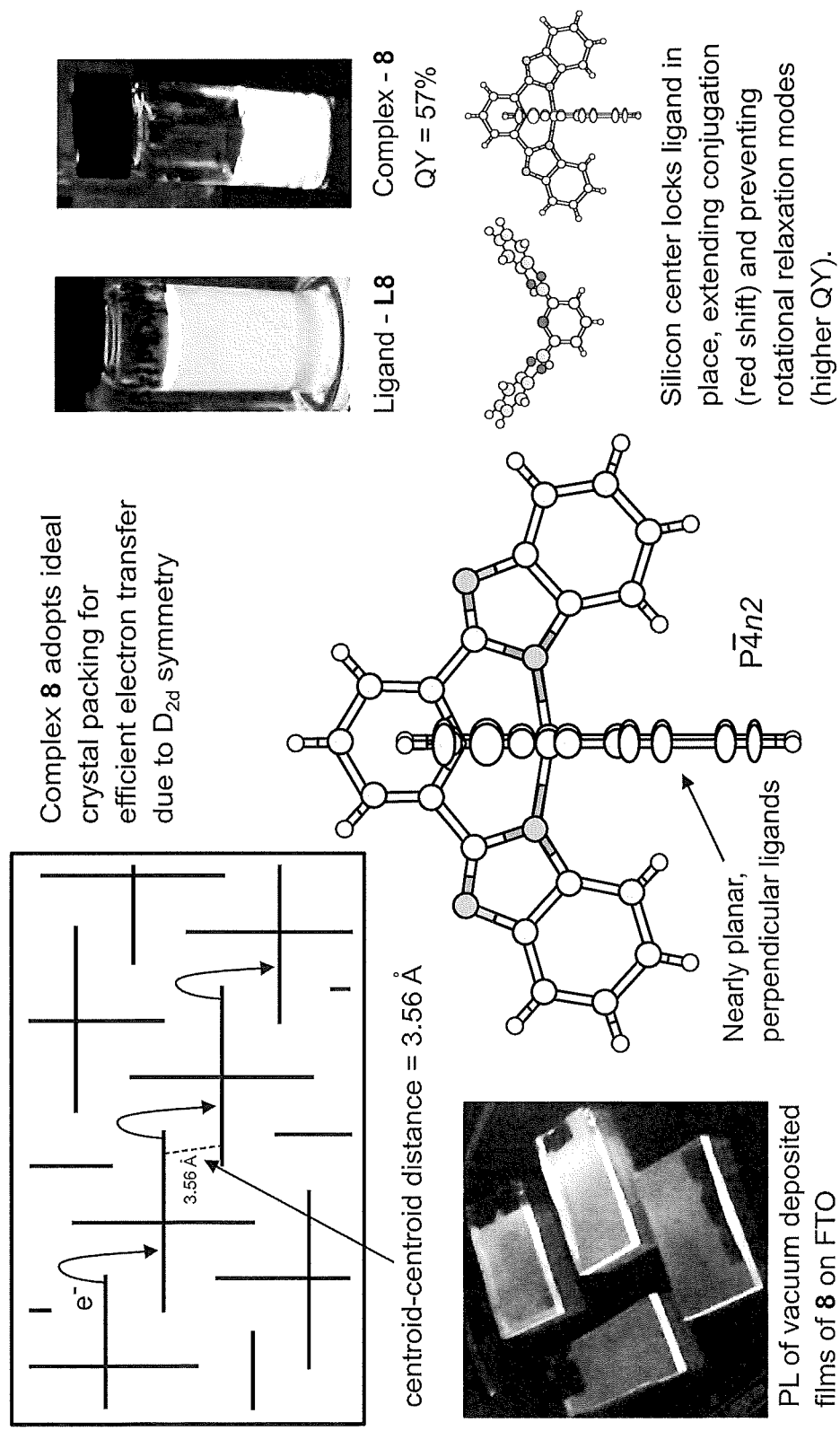
FIG. 6 illustrates various properties of hexacoordinate complex Si(bzimpy)$_2$.

The observed properties of 8, were consistent with predictions and attractive for electronic device applications (FIG. 6). Single crystals of 8 suitable for x-ray crystallography were grown from evaporation of $CH_2Cl_2$. The resulting structure, with space group P$\bar{4}$n2, shows that the bzimpy ligand is very nearly planar and perpendicular to the other bzimpy ligand. The complex crystallizes in a pattern ideal for electron transport, with significant pi overlap and short hopping distance (3.56 Å). The emission from the complex is significantly red shifted from the free ligand due to the extended conjugation resulting from the rigid ligand geometry imposed by the hexacoordinate silicon center. Furthermore, the sample retains its fluorescence in the solid state, and thin films of 8 were readily grown on FTO and glass slides via vacuum deposition.

Figure 7:
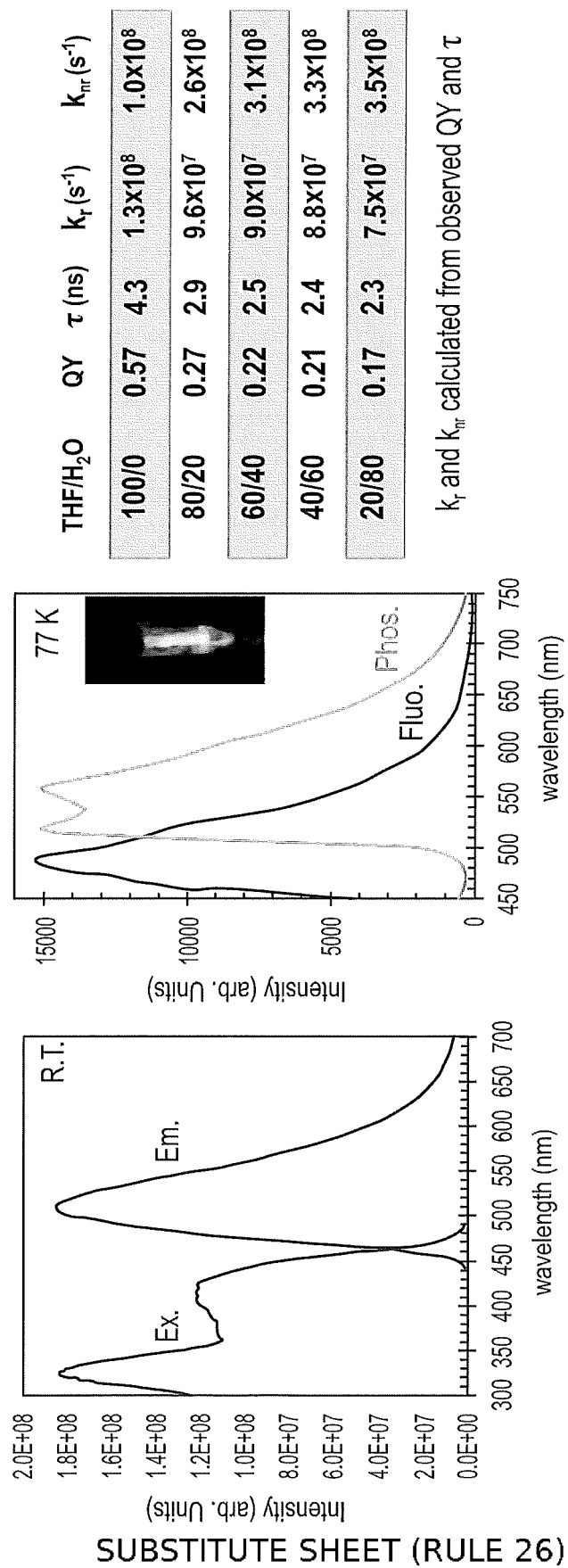
FIG. 7 provides spectral properties of Si(bzimpy)$_2$.

Spectroscopic studies show that 8 (THF, room temperature) emits with a $\lambda_{max}$=510 nm and a QY=57% (FIG. 7). By comparison, Alq$_3$ emits with a $\lambda_{max}$=526 nm and a QY=15% in solution. At 77K, the fluorescence blue shifts to 485 nm and a slow phosphorescence with peaks at 525 and 570 nm is visible for several seconds following excitation. The high triplet energy state, E=2.38 eV, and low singlet-triplet energy gap, $\Delta E_{ST}$, are useful for triplet exciton device engineering. As with the free bzimpy ligand, the presence of water has a quenching effect on the emission of the dye, affecting both the radiative and non-radiative rate, but there was no evidence of hydrolysis of the complex even after 3 weeks in a 50/50 mixture of THF/water.

Figure 8:
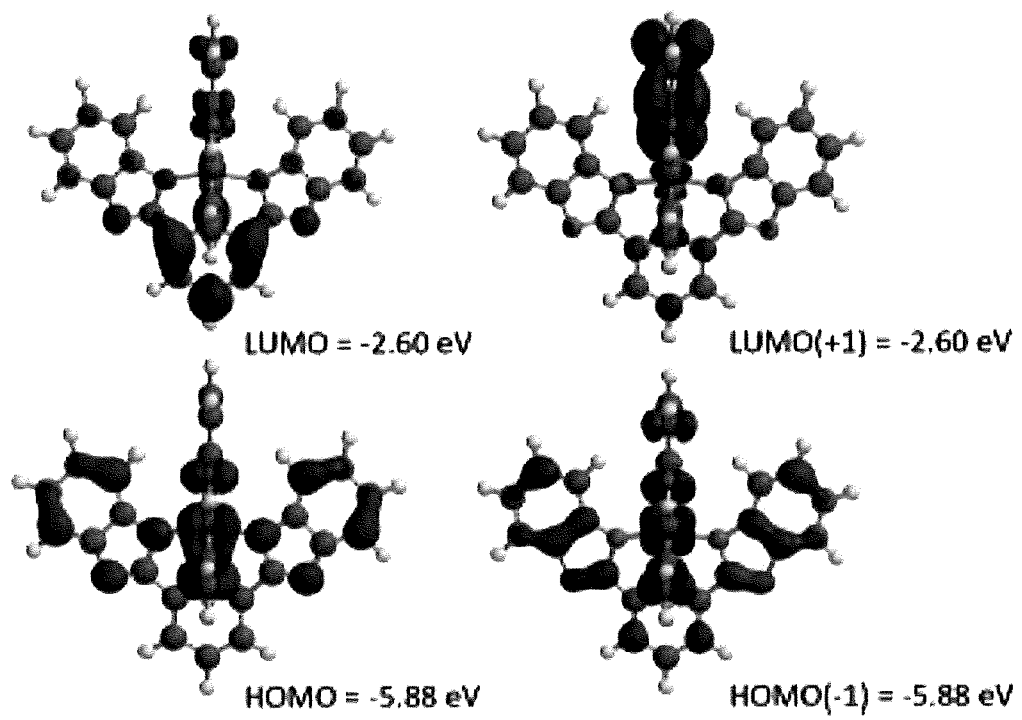
FIG. 8 illustrates calculated HOMO and LUMO orbitals for Si(bzimpy)$_2$.

Theoretical modelling of Si(bzimpy)$_2$ was performed using DFT with B3LYP/6-31G* functional and basis set and provided results consistent with the experimental observations. Geometry optimization provides a structure consistent with the obtained crystal structure, and calculated 1H-NMR shifts predict the large upfield shift for the C7-1H peak. TD-DFT calculations also adequately reproduce the observed UV-vis spectrum (FIG. 7). Modelling predicts both the HOMO and LUMO are nearly double degenerate, with the HOMOs mostly localized on the benzimidazole rings and the LUMOs mostly localized on the pyridine ring (FIG. 8). The complex can be described as a push-pull system with silicon enhancing delocalization by enforcing planarity. This demonstrates further synthetic tuning of the optical properties of Si(pincer)$_2$ complexes is possible through rational design. Furthermore, the theoretical gas phase E(LUMO) level at −2.6 eV compares well with the experimentally determined E(LUMO)=−3.4 eV determined from CV experiments, E(LUMO)=−e[E$_{red,onset}$+4.8 V].

Figure 9A:
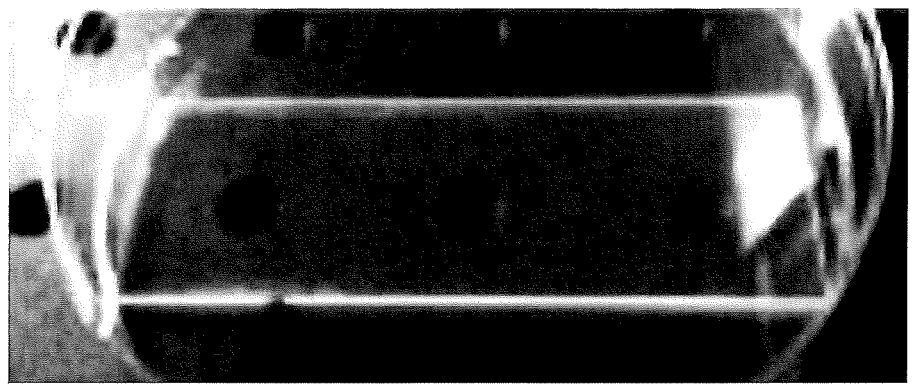
FIG. 9(a) illustrates Si(bzimpy)$_2$ film deposited on glass according to some embodiments.
Figure 9B:
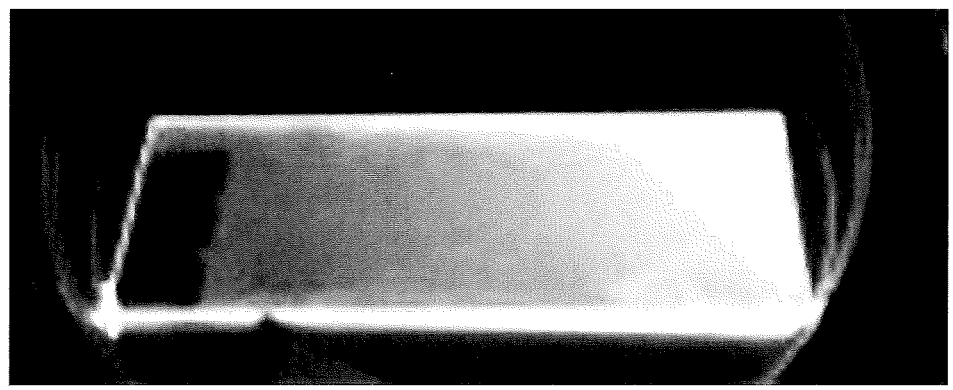
FIG. 9(b) illustrates luminescence of the Si(bzimpy)$_2$ film of FIG. 9(a) under UV excitation.
Figure 9C:
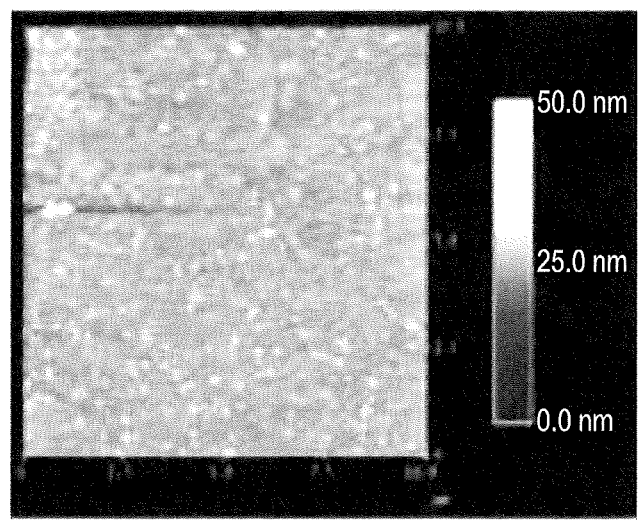
FIG. 9(c) illustrates atomic force microscopy (AFM) analysis of the Si(bzimpy)$_2$ film of FIG. 9(a).
Figure 9D:
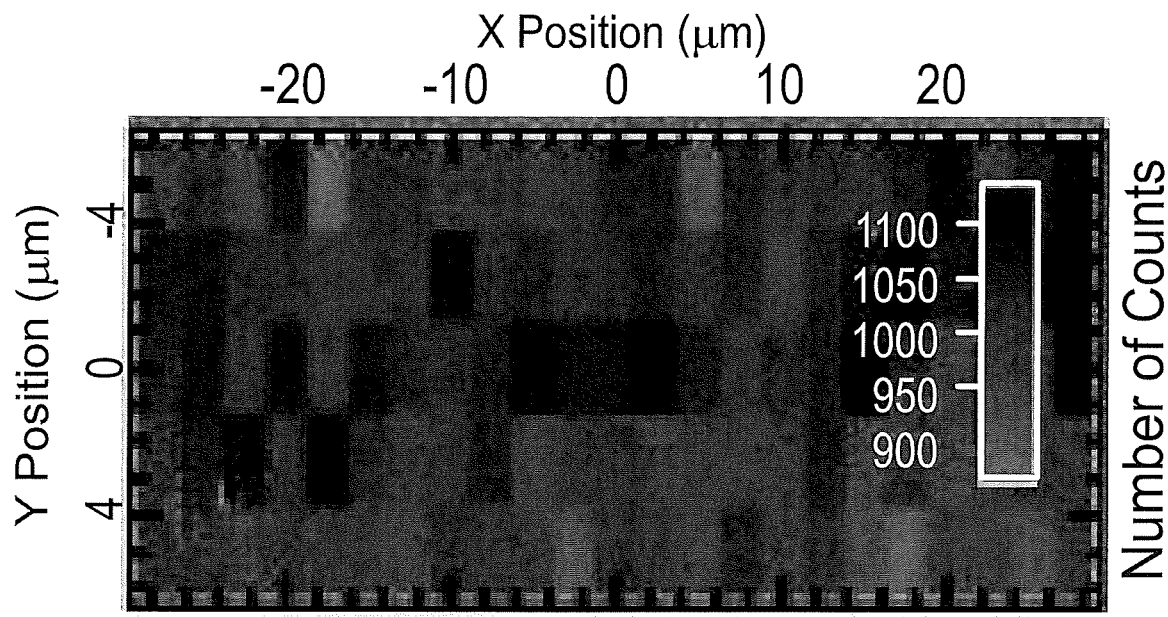
FIG. 9(d) fluorescent imaging of the Si(bzimpy)$_2$ film of FIG. 9(a).
Figure 9D:
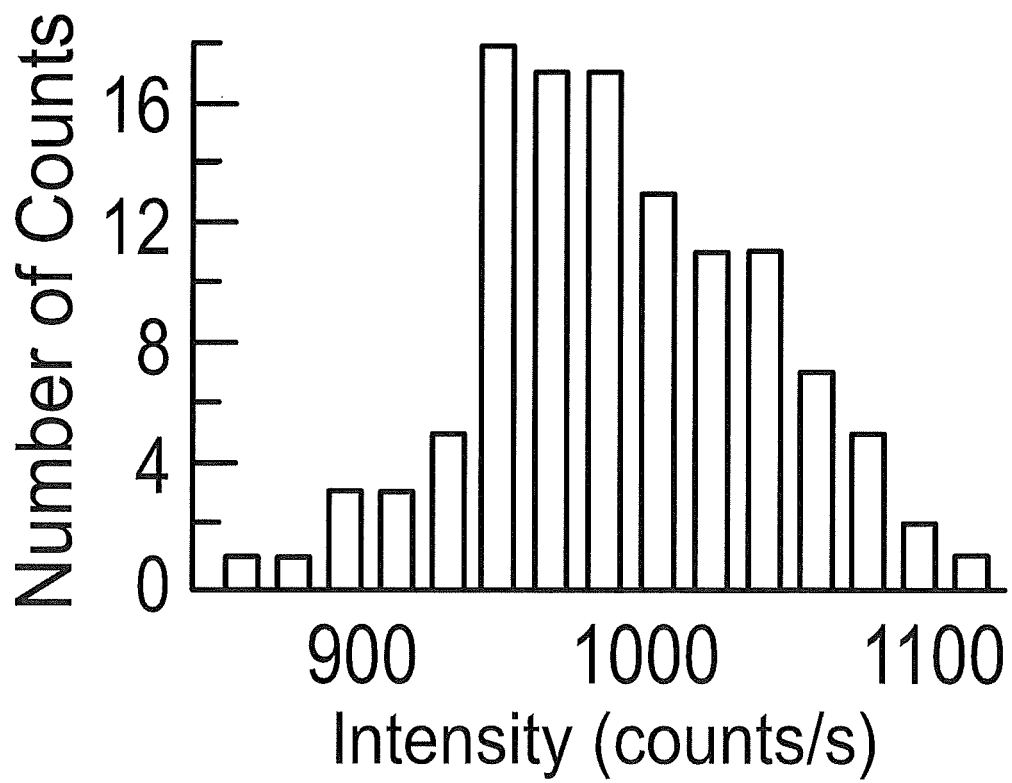

Si(bzimpy)$_2$ was easy to evaporate and deposit due to the low molecular weight and negligible dipole moment. Thin films were grown on silica glass substrates using a glovebox integrated thermal deposition system. The deposited films were optically non-scattering and strongly colored (see FIG. 9a) and they were luminescent under UV excitation (FIG. 9b). Fluorescence spectroscopy of the film indicated a slight red-shift in the emission relative to solution to a $\lambda_{max}$=549 nm. AFM analysis of a 64 nm thick film indicated a root mean square roughness R$_{rms}$=2.8 nm and a mean roughness of 1.6 nm (FIG. 9c). Fluorescence imaging of the deposited film also indicated a smooth surface with uniform PL intensity ranging less than 10% (FIG. 9d).

Figure 10:
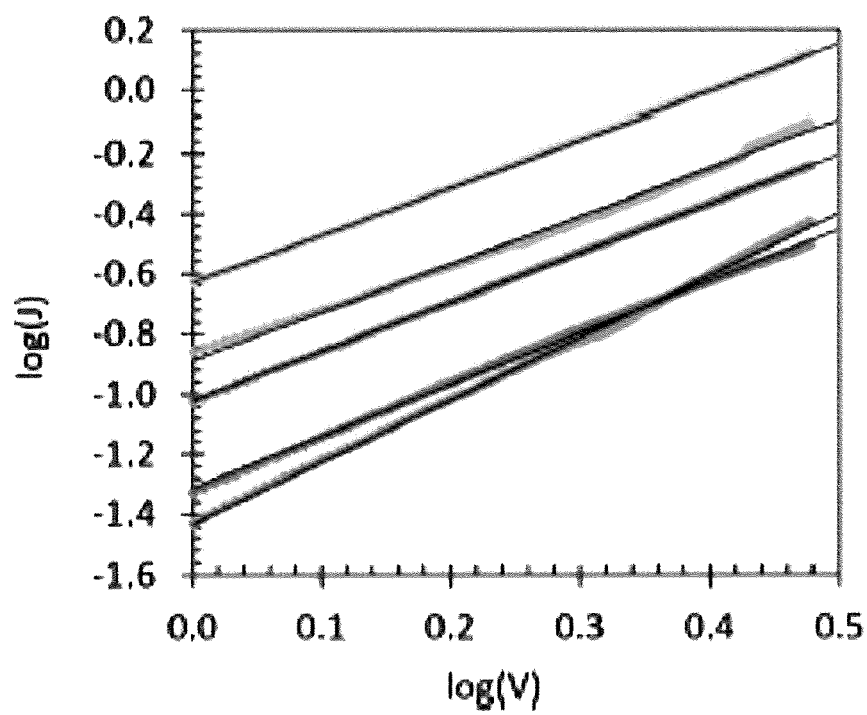
FIG. 10 illustrates charge mobility curves for Si(bzimpy)$_2$ films (64 nm) sandwiched between ITO and aluminum electrodes according to some embodiments.

To explore the charge transport properties, thin films of Si(bzimpy)$_2$ were grown on ITO followed by deposition of an aluminum contact. The thickness of the films was determined to be 64.1+/−0.2 nm with a substrate/film intermix of 5.7+/−0.5 nm according to spectroscopic ellipsometry over the range 0.65 to 4.1 eV. A log (J)-log (V) plot of the devices shows linear behavior (R$^2$>0.99) over the 1-3 V region with slopes ranging between 1.6 and 2.1 consistent with a space charge limited current, SCLC regime. The charge mobility of Si(bzimpy)$_2$ was calculated from the slopes of the J vs. V$^2$ curves (FIG. 10) of the devices in the SCLC region according to the Mott-Gurney equation with L=64 nm and ε=3.

$$J = \frac{9}{8}\varepsilon\varepsilon_0\mu\frac{V_a^2}{L^3}$$

The five samples gave an average $\mu$=6.3×10$^{-5}$ cm$^2$ V$^{-1}$ s$^{-1}$ with a standard deviation of 3.4×10$^{-5}$ cm$^2$ V$^{-1}$ s$^{-1}$ (ambient temperature and applied field of 1.5×10$^5$ to 7.8×10$^5$ V cm$^{-1}$). This value is comparable to the electron mobility of Alq$_3$ which was reported as 1.4×10$^{-6}$ cm$^2$ V$^{-1}$ s$^{-1}$ (ambient temperature and applied field of 4×10$^5$ V cm$^{-1}$). The spread in mobility values could result from variations in film quality, crystallinity and orientation.

Example 2—Optoelectronic Device

A single-layer OLED consisting exclusively of Si(bzimpy)$_2$ sandwiched between ITO and aluminum was fabricated as shown in FIG. 11. Application of 12 V resulted in a yellow-green emission, with a $\lambda_{max}$=560 nm. The unprotected devices lasted about 1 minute in a nitrogen filled glovebox before failing. This successful demonstration of a single-layer Si(bzimpy)$_2$ OLED device demonstrated the feasibility of hexacoordinate complexes described herein as candidates for charge transport and/or electroluminescent materials in organic electronic devices.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:
1. A hexacoordinate complex comprising:
   a central atom selected from the group consisting of silicon, germanium, and tin; and
   two pincer ligands bound to the central atom, wherein the hexacoordinate complex is luminescent, wherein the pincer ligands are dianionic and at least one binding site of the pincer ligands comprises a heteroaryl moiety, and wherein the hexacoordinate complex has a quantum yield greater than 50 percent when measured in THF at room temperature.

2. The hexacoordinate complex of claim 1, wherein the hexacoordinate complex emits light in the visible region of the electromagnetic spectrum.

3. The hexacoordinate complex of claim 1, wherein hexacoordinate complex is homoleptic.

4. The hexacoordinate complex of claim 1, wherein hexacoordinate complex is heteroleptic.

5. The hexacoordinate complex of claim 1, wherein the heteroaryl moiety comprises a pyridine, triazole or triazine moiety.

6. The hexacoordinate complex of claim 1, wherein at least one of the pincer ligands comprises a fused aryl moiety.

7. The hexacoordinate complex of claim 1, wherein at least one of the pincer ligands comprises one or more conjugated structures.

8. A hexacoordinate complex comprising:
a central atom selected from the group consisting of silicon, germanium, and tin; and
two pincer ligands bound to the central atom, wherein the difference between the highest occupied molecular orbital (HOMO) and lowest unoccupied molecular orbital (LUMO) of the hexacoordinate complex is at least 1.5 eV, and wherein the hexacoordinate complex is heteroleptic.

9. The hexacoordinate complex of claim 8, wherein the difference between the HOMO and LUMO is at least 2.5 eV.

10. The hexacoordinate complex of claim 8, wherein the difference between the HOMO and LUMO is at least 3 eV.

11. The hexacoordinate complex of claim 8, wherein the difference between the HOMO and LUMO is at least 4 eV.

12. The hexacoordinate complex of claim 8, wherein the difference between the HOMO and LUMO is 1.5 eV to 4.8 eV.

13. The hexacoordinate complex of claim 8 having luminescence.

14. The hexacoordinate complex of claim 13, wherein the luminescence is in the visible region of the electromagnetic spectrum.

15. The hexacoordinate complex of claim 8, wherein at least one binding site of the pincer ligands comprises a heteroaryl moiety.

16. The hexacoordinate complex of claim 15, wherein the heteroaryl moiety comprises a pyridine, triazole or triazine moiety.

17. The hexacoordinate complex of claim 8, wherein at least one of the pincer ligands comprises a fused aryl moiety.

18. The hexacoordinate complex of claim 8, wherein at least one of the pincer ligands comprises one or more conjugated structures.

19. The hexacoordinate complex of claim 8, wherein the pincer ligands are dianionic.

20. An optoelectronic device comprising:
a layer including hexacoordinate complex, the hexacoordinate complex comprising a central atom selected from the group consisting of silicon, germanium, and tin, and two pincer ligands bound to the central atom, wherein the difference between the highest occupied molecular orbital (HOMO) and lowest unoccupied molecular orbital (LUMO) of the hexacoordinate complex is at least 1.5 eV.

21. The optoelectronic device of claim 20, wherein the difference between the HOMO and LUMO is at least 2.5 eV.

22. The optoelectronic device of claim 20, wherein the layer has a thickness of 50 nm to 300 nm.

23. The optoelectronic device of claim 20, wherein layer is arranged between electrodes.

24. The optoelectronic device of claim 23, wherein the layer including the hexacoordinate complex is a charge transport layer.

25. The optoelectronic device of claim 24, wherein the charge transport layer is an electron transport layer.

26. The optoelectronic device of claim 20, wherein the optoelectronic device is an organic light emitting diode.

27. The optoelectronic device of claim 20, wherein the optoelectronic device is a photovoltaic.

28. The optoelectronic device of claim 20, wherein at least one binding site of the pincer ligands comprises a heteroaryl moiety.

29. The optoelectronic device of claim 28, wherein the heteroaryl moiety comprises a pyridine, triazole or triazine moiety.

30. The optoelectronic device of claim 20, wherein at least one of the pincer ligands comprises a fused aryl moiety.

31. The optoelectronic device of claim 20, wherein at least one of the pincer ligands comprises one or more conjugated structures.

* * * * *